(12) United States Patent
Li et al.

(10) Patent No.: US 11,274,224 B2
(45) Date of Patent: Mar. 15, 2022

(54) INK COMPOSITION, METHOD FOR FORMING A CONDUCTIVE MEMBER, AND CONDUCTIVE DEVICE

(71) Applicant: Kuprion Inc., San Jose, CA (US)

(72) Inventors: Zhenggang Li, Singapore (SG); Yeng Ming Lam, Singapore (SG); Chee Lip Gan, Singapore (SG); Jaewon Kim, Singapore (SG); Alfred A. Zinn, Bethesda, MD (US)

(73) Assignee: Kuprion Inc., San Jose, CA (US)

( * ) Notice: Subject to any disclaimer, the term of this patent is extended or adjusted under 35 U.S.C. 154(b) by 225 days.

(21) Appl. No.: 16/337,917

(22) PCT Filed: Sep. 27, 2017

(86) PCT No.: PCT/SG2017/050483
§ 371 (c)(1),
(2) Date: Mar. 28, 2019

(87) PCT Pub. No.: WO2018/063097
PCT Pub. Date: Apr. 5, 2018

(65) Prior Publication Data
US 2019/0225827 A1    Jul. 25, 2019

Related U.S. Application Data

(60) Provisional application No. 62/402,290, filed on Sep. 30, 2016.

(51) Int. Cl.
*C09D 11/52*    (2014.01)
*C09D 11/322*   (2014.01)
(Continued)

(52) U.S. Cl.
CPC ............ *C09D 11/52* (2013.01); *B22F 1/0014* (2013.01); *B22F 1/0022* (2013.01);
(Continued)

(58) Field of Classification Search
CPC ...... B22F 1/0014; B22F 1/0018; C09D 11/52; C09D 5/24
(Continued)

(56) References Cited

U.S. PATENT DOCUMENTS 7,736,414 B1    6/2010  Zinn
10,308,856 B1 *  6/2019  Wang ...................... C09K 5/14
(Continued)

FOREIGN PATENT DOCUMENTS

KR     20120088313 A  *  8/2012  ............. C09D 11/52
WO     2013063161 A2     5/2013
WO     WO-2015183034 A1 * 12/2015  ............ B22F 1/0062

OTHER PUBLICATIONS

ISRWO of corresponding PCT/SG2017/050483 dated Dec. 29, 2017.
(Continued)

*Primary Examiner* — Tri V Nguyen
(74) *Attorney, Agent, or Firm* — Vorys, Sater, Seymour and Pease LLP (57) ABSTRACT

According to embodiments of the present invention, an ink composition is provided. The ink composition includes a plurality of nanostructures distributed in at least two cross-sectional dimension ranges, wherein each nanostructure of the plurality of nanostructures is free of a cross-sectional dimension of more than 200 nm. According to further embodiments of the present invention, a method for forming a conductive member and a conductive device are also provided.

16 Claims, 5 Drawing Sheets

(51) Int. Cl.

| | |
|---|---|
| *C09D 11/36* | (2014.01) |
| *H01B 1/22* | (2006.01) |
| *H01B 1/02* | (2006.01) |
| *H05K 1/09* | (2006.01) |
| *B82Y 40/00* | (2011.01) |
| *C09D 5/24* | (2006.01) |
| *B22F 1/00* | (2022.01) |
| *B41M 5/00* | (2006.01) |
| *B41M 7/00* | (2006.01) |
| *C09D 11/033* | (2014.01) |
| *C09D 11/037* | (2014.01) |
| *C09D 11/38* | (2014.01) |
| *H01B 5/14* | (2006.01) |
| *H01B 13/00* | (2006.01) |
| *H05K 3/12* | (2006.01) |
| *B82Y 30/00* | (2011.01) |
| *B33Y 70/00* | (2020.01) |
| *B22F 7/08* | (2006.01) |
| *B22F 10/10* | (2021.01) |

(52) U.S. Cl.
CPC .......... *B41M 5/0023* (2013.01); *B41M 7/009* (2013.01); *B82Y 40/00* (2013.01); *C09D 5/24* (2013.01); *C09D 11/033* (2013.01); *C09D 11/037* (2013.01); *C09D 11/322* (2013.01); *C09D 11/36* (2013.01); *C09D 11/38* (2013.01); *H01B 1/026* (2013.01); *H01B 1/22* (2013.01); *H01B 5/14* (2013.01); *H01B 13/0016* (2013.01); *H05K 1/097* (2013.01); *H05K 3/1283* (2013.01); *B22F 1/0062* (2013.01); *B22F 7/08* (2013.01); *B22F 10/10* (2021.01); *B22F 2998/10* (2013.01); *B22F 2999/00* (2013.01); *B33Y 70/00* (2014.12); *B82Y 30/00* (2013.01); *H05K 2201/0245* (2013.01); *H05K 2201/0257* (2013.01); *H05K 2201/0266* (2013.01); *H05K 2201/0272* (2013.01)

(58) Field of Classification Search
USPC .......................................... 252/512; 106/1.18
See application file for complete search history.

(56) References Cited

U.S. PATENT DOCUMENTS

| | | | |
|---|---|---|---|
| 2008/0286488 A1 | 11/2008 | Li et al. | |
| 2010/0009071 A1 | 1/2010 | Chopra et al. | |
| 2011/0244117 A1* | 10/2011 | Saban ...................... | C09D 7/67 427/98.4 |
| 2012/0037041 A1* | 2/2012 | Nolte ........................ | B22F 9/24 106/287.18 |
| 2012/0321783 A1* | 12/2012 | Hampden-Smith ...... | C09D 7/70 427/162 |
| 2017/0197244 A1* | 7/2017 | Choi ......................... | B22F 9/24 |

OTHER PUBLICATIONS

Choi, Y-H. et al., Effect of the Amine Concentration on Phase Evolution and Densification in Printed Films Using Cu (II) Complex Ink., Langmuir, Jul. 7, 2015, vol. 31, No. 29, pp. 8101-8110.
Shankar, R. et al., Non-aqueous synthesis of silver nanoparticles using tin acetate as a reducing agent for the conductive ink formulation in printed electronics. Journal of Materials Chemistry, Jun. 20, 2011, vol. 21, No. 29, pp. 10871-10877.
Woo, K. et al., Ink-Jet Printing of Cu—Ag-Based Highly Conductive Tracks on a Transparent Substrate. Langmuir, Nov. 26, 2008, vol. 25, No. 1, pp. 429-433.
Sierra-Avila, R. et al., Synthesis of Copper Nanoparticles Coated with Nitrogen Ligands. Journal of anomaterials, May 28, 2014, vol. 2014, pp. 361791:1-361791:8.
Piao, L. et al., A Facile Synthetic Method of Silver Nanoparticles with a Continuous Size Range from sub-10 nm to 40 nm. Bulletin of the Korean Chemical Society, Jan. 20, 2011, vol. 32, No. 1, pp. 117-121.

* cited by examiner

INK COMPOSITION, METHOD FOR FORMING A CONDUCTIVE MEMBER, AND CONDUCTIVE DEVICE

CROSS-REFERENCE TO RELATED APPLICATIONS

This application is the U.S. national phase of PCT/SG2017/050483 filed on Sep. 27, 2017, which claims the benefit and priority to U.S. provisional application No. 62/402,290, filed 30 Sep. 2016, the contents of which are hereby incorporated by reference in their entireties for all purposes.

TECHNICAL FIELD

Various embodiments relate to an ink composition, a method for forming a conductive member, and a conductive device.

BACKGROUND

Flexible electronics are electronic devices that are bendable, stretchable and/or potentially foldable without any significant loss in performance. In recent years, flexible electronics devices including flexible LCDs (liquid crystal displays), organic light emitting diodes (OLEDs) and organic solar cells have gained increasing popularity. According to one market report, the total market for flexible electronics will grow rapidly to more than $13 billion by 2020. One of the most important components for these flexible devices is the electrode. Electrodes in such applications have to meet two very important criteria—they have to be highly conductive and they have to be bendable and stretchable without severe decrease in conductivity.

Generally, metal is the ideal candidate as the electrode material due to its superior electrical conductivity. The deposition of metal electrode usually employs vacuum based deposition techniques, which will impose high processing cost. Doped tin oxide (indium-doped tin oxide (ITO), fluorine-doped tin oxide (FTO)) is commonly used in optoelectronic devices and gains popularity due to its combined advantages of high electrical conductivity and high optical transparency. Nevertheless, doped tin oxide electrodes are generally rigid and have low tolerance to mechanical bending or stretching. Recently, the industry is able to produce ITO electrodes on curved substrates, which leads to revolutionary TVs/smart phones with curved display panels. Despite excellent progress made in this technology, ITO/FTO electrodes are rigid and still far from being flexible. Therefore, new material approaches need to be explored and adopted.

Conductive inks containing metal nanostructures have been successfully developed and employed for solution processable electrodes. The resulting electrodes have high electrical conductivity and at the same time have a high degree of flexibility due to the formation of interconnected nanostructured networks. Silver (Ag) nanostructures (including nanoparticles and nanowires) based conductive inks have been commercialized. They have been widely used in various applications such as printed circuit boards, flexible circuits and touch screen panels. The success of Ag inks could be attributed to their good electrical performance as well as chemical inertness as Ag has a high oxidation resistance. However, the price of Ag is extremely high, over $500/kg as compared with around $3/kg for copper (Cu), which prohibits its low-cost applications.

SUMMARY

The invention is defined in the independent claims. Further embodiments of the invention are defined in the dependent claims.

According to an embodiment, an ink composition is provided. The ink composition may include a plurality of nanostructures distributed in at least two cross-sectional dimension ranges, wherein each nanostructure of the plurality of nanostructures is free of a cross-sectional dimension of more than 200 nm.

According to an embodiment, a method for forming a conductive member is provided. The method may include applying an ink composition as described herein on a substrate, and fusing the plurality of nanostructures of the ink composition to each other to form the conductive member.

According to an embodiment, a conductive device is provided. The conductive device may include a substrate, and a conductive member on the substrate, wherein the conductive member is made of the ink composition as described herein, the ink composition processed to fuse the plurality of nanostructures of the ink composition to each other.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Throughout the description, while references may be made to copper (Cu) (e.g., NanoCu ink), this is by way of non-limiting examples, and it should be appreciated that other materials may be employed in various embodiments.

Various embodiments may relate to an ink and flexible electronics applications.

Various embodiments may provide low temperature sinter-able nanoparticles (e.g., copper (Cu) nanoparticles) ink for flexible electrodes.

Various embodiments may provide a highly stable ink (e.g., based on copper (Cu) nanostructures (NanoCu)) with an oxidation stability of more than one year and a suspension stability of more than one month. The nanostructures of various embodiments may include, but not limited to, nanoparticles, nanoplates, nanorods, nanowires, or a mixture of any of the above-mentioned shapes. The solvents used may include, but not limited to, short chain alcohols, and short chain amines may be employed as surfactants. The amines in the ink or system may also provide a reducing environment, which may be beneficial for the extension of the shelf life of the ink (e.g., NanoCu ink). The use of short chain, low boiling point solvents and/or surfactants may enable low temperature sintering of the NanoCu ink. For example, a sheet resistance of less than $1\Omega/\square$ may be achieved by annealing the NanoCu ink at about 150° C. The nanoparticles thin film prepared using the ink (e.g., Cu ink) of various embodiments on a polyimide substrate exhibits very good mechanical flexibility (the resistance change may be kept as low as 23% after 1000 cycles of bending test).

Various embodiments may provide a Cu nanostructure-based ink that may be deposited onto substrates through solution based deposition methods, and following that, the ink may be annealed to form highly conductive films/patterns. Various embodiments may provide one or more of the following:

(i) In the ink formulation, one or more short chain alcohols may be used as the solvent and one or more short chain amines may be used as the ligand (or surfactant). The use of short chain solvents and ligands may facilitate easy removal of liquid content, thus reducing the annealing temperature.

(ii) The amine(s) in the ink formulation not only function as a capping ligand but may also play a role in providing a reducing environment, which may protect Cu nanoparticles from oxidization, prolonging the shelf life of the ink and lowering the annealing temperature.

(iii) Cu nanostructures with diverse shapes such as spherical nanoparticles, nanorods, nanowires, nanoplates and even a mixture of any of them may be adopted into the ink. The variation in the shape of nanoparticles may result in different ink properties (optical, and/or electrical, and/or mechanical) and applications.

(iv) The Cu nanoparticles in the ink may have more than one distinct size distribution. In various embodiments, the nanoparticles may include two size distributions: small particles (e.g., about 5~10 nm, or about 2~20 nm) and large particles (e.g., about 30~100 nm, or about 30~200 nm). The small particles may be likely to occupy the empty space between the big particles, which may help in film densification (upon sintering).

(v) The Cu ink may be deposited using solution deposition techniques including but not limited to spin coating, drop casting, spray coating, doctor blading, inkjet printing, aerosol jet printing and roll-to-roll processes.

(vi) The ink formulation or composition may allow low temperature sintering. For example, a sheet resistance of less than $1\Omega/\square$ may be achieved by annealing the NanoCu ink at about 150° C., whereas most commercial Cu ink requires a temperature of higher than 250° C.

(vii) The Cu nanoparticles ink may be able to offer a very good mechanical flexibility due to one or more additives (e.g., polymeric additive(s)). The resistance change after 1000 cycles of cyclic bending test may be as low as about 23%.

(viii) The copper nanoparticles may be at least substantially free of oxides, whereas most commercially available copper nanoparticles are coated with a layer of oxide.

As compared to commercially available Cu inks, various embodiments of the NanoCu ink may provide one or more of the following:

(i) Low sintering temperature: The NanoCu ink may be able to achieve high conductivity ($\sim 1\Omega/\square$) at low annealing temperature (150° C.) while known Cu inks have to be annealed at higher temperatures (more than 250° C.). This may be due to the use of one or more of the following in the NanoCu ink of various embodiments: (i) nanostructures with two distinct size distributions, including, for example, the small sized nanoparticles (e.g. about 2~20 nm), (ii) a low boiling point volatile solvent-surfactant combination, and (iii) amine surfactant which also serves as reducing agent in the NanoCu ink.

(ii) Low resistivity: The thin film resistivity of the annealed NanoCu ink of various embodiments may go as low as $5.0 \times 10^{-6}$ $\Omega \cdot$cm, which is about three times of bulk Cu value. The resistivity of known commercial Cu inks is in the range of $10^{-4}$ $\Omega \cdot$cm and above.

(iii) High stability: The NanoCu ink of various embodiments may show high oxidation stability of more than one year and good suspension stability of more than one month. The ink may be re-suspended through ultrasonication and stirring after settling down.

Figure 1A:
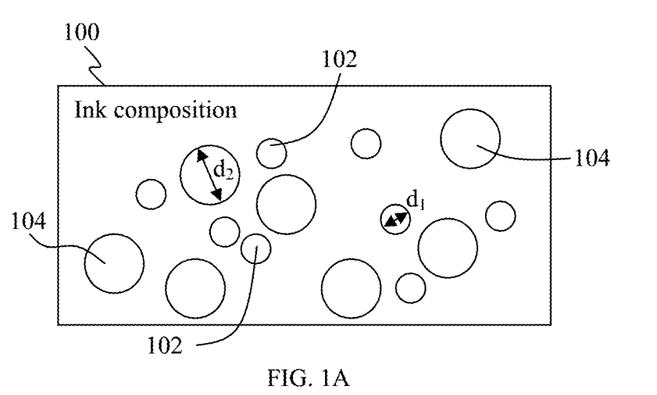
FIG. 1A shows a schematic diagram of an ink composition, according to various embodiments.

FIG. 1A shows a schematic diagram of an ink composition 100, according to various embodiments. The ink composition 100 includes a plurality of nanostructures 102, 104 distributed in at least two cross-sectional dimension ranges, wherein each nanostructure of the plurality of nanostructures 102, 104 is free of a cross-sectional dimension of more than 200 nm (i.e., >200 nm).

In other words, an ink or ink composition 100 having a plurality of nanostructures 102, 104 may be provided. The ink composition 100 may include nanostructures 102, 104 whose (corresponding) cross-sectional dimension (e.g., diameter) (e.g., $d_1$, $d_2$) may be in or within at least two cross-sectional dimension ranges (or distributions). For example, the ink composition 100 may include, out of the plurality of nanostructures 102, 104, a first group of nanostructures (e.g., 102 as illustrated for two such nanostructures) distributed in or within a first cross-sectional dimension range (e.g., a range of smaller cross-sectional dimension), and a second group of nanostructures (e.g., 104 as illustrated for two such nanostructures) distributed in or within a second cross-sectional dimension range (e.g., a range of larger cross-sectional dimension). This may mean that the nanostructures 102 may have a cross sectional dimension ($d_1$) in or within a first (size) range or distribution, and the nanostructures 104 may have a cross sectional dimension ($d_2$) in or within a second (size) range or distribution. The at least two cross-sectional dimension ranges are nanometer or nano-sized ranges. The numerical values of the cross-sectional dimension of one of the at least two cross-sectional dimension ranges may be smaller than the other. By having nanostructures 102, 104 with different cross-sectional dimensions, i.e., being distributed in at least two ranges, smaller nanostructures 102 may slot or fill in the empty space or void between larger nanostructures 104.

It should be appreciated that the nanostructures 102 may have a uniform cross-sectional dimension or different cross-sectional dimensions in or within the first (size) range, and/or the nanostructures 104 may have a uniform cross-sectional dimension or different cross-sectional dimensions in or within the second (size) range. Further, the nanostructures 102 may have a uniform shape or different shapes, and/or the nanostructures 104 may have a uniform shape or different shapes. The nanostructures 102 and the nanostructures 104, relative to one another, may have a uniform shape or different shapes.

In various embodiments, any (or all) related cross-sectional dimension of each of the nanostructures 102, 104 may be 200 nm or less (i.e., ≤200 nm), e.g., ≤150 nm, or ≤100 nm. This may mean that, for all of the nanostructures 102, 104 included in the ink composition 100, each nanostructure 102, 104 may not have a cross-sectional dimension exceeding 200 nm. By having smaller-sized nanostructures having cross-sectional dimensions ≤200 nm, these nanostructures may have a higher surface energy, which may lead to lowering of the temperature for sintering or fusing these nanostructures to one another. In the context of various embodiments, the feature or phrase "wherein each nanostructure of the plurality of nanostructures is free of a cross-sectional dimension of more than 200 nm" may mean that each nanostructure 102, 104 may have a maximum cross-sectional dimension of 200 nm or less.

The at least two cross-sectional dimension ranges may be different from one another. The at least two cross-sectional dimension ranges may be separate ranges or non-overlapping ranges.

The term "cross-sectional dimension" may mean a dimension of a cross-section of the nanostructure defined along a transverse axis of the nanostructure, for example, the distance between two points on a boundary or outer surface of the nanostructure.

In the context of various embodiments, the ink composition 100 may be in liquid form, meaning an ink solution.

In the context of various embodiments, the (entire) ink composition 100 may be free flowing.

In the context of various embodiments, the ink composition 100 may be a printable ink composition, for example, adapted or suitable for inkjet printing.

In the context of various embodiments, the ink composition 100 per se or in pristine form, may be at least substantially non-conductive. While the nanostructures 102, 104 themselves may be at least substantially conductive, the ink composition 100, as a whole, may be at least substantially non-conductive.

In various embodiments, the at least two cross-sectional dimension ranges may be spaced apart from each other, for example, by at least about 10 nm, e.g., about 10 nm, about 20 nm, about 30 nm, or about 50 nm.

In various embodiments, the at least two cross-sectional dimension ranges may include a first range of between about 2 nm and about 20 nm (i.e., about 2-20 nm; for smaller nanostructures (e.g., nanostructures 102)) and a second range of between about 30 nm and about 200 nm (i.e., 30-200 nm; for larger nanostructures (e.g., nanostructures 104)). This may mean that the nanostructures 102, 104 may be ≤200 nm. A nanostructure having a cross-sectional dimension of below 2 nm may be unstable due to its high surface energy. As non-limiting examples, the first range may be about 2-15 nm, about 2-10 nm, about 5-20 nm, about 10-20 nm, or about 5-10 nm. The second range may be about 30-150 nm, about 30-100 nm, about 30-50 nm, about 50-200 nm, about 100-200 nm, about 40-100 nm, or about 50-100 nm. In further embodiments, the first range may be about 5-10 nm and the second range may be about 30-100 nm (meaning that the nanostructures 102, 104 may be 100 nm).

Having small-sized nanostructures below 20 nm may lead to a low sintering temperature (for fusing the nanostructures). It may be expected that when the size (or cross-sectional dimension) of nanostructures fall below about 20 nm, the melting point may be dependent on the size of the nanostructures, with a lower melting point for smaller size nanostructures. Accordingly, it may be appreciated that small nanostructures may contribute or lead to a low sintering temperature. Without wishing to be bound by theory, the lower sintering temperature may be because of the small nanostructures having a high surface energy. Further, the smaller nanostructures may be able or likely to occupy or fill in the empty space between the larger nanostructures, which may enhance film densification when the ink composition is subsequently processed to form a conductive layer or conductive member.

It should be appreciated that, in some embodiments, the amount of the nanostructures 102 may be more than the amount of the nanostructures 104, while, in further embodiments, the amount of the nanostructures 104 may be more than the amount of the nanostructures 102.

In various embodiments, an amount of the plurality of nanostructures 102, 104 in the ink composition 100 may be between about 1 wt % (weight percentage) and about 60 wt % (weight percentage). For example, the amount may be between about 1 wt % and about 50 wt %, preferably, between about 5 wt % and about 40 wt %, between about 10 wt % and about 30 wt %, between about 15 wt % and about 25 wt %, between about 20 wt % and about 30 wt % or, optimally, between about 10 wt % and about 30 wt %, depending on applications.

The plurality of nanostructures 102, 104 may include a metal. The metal may include a transition metal. In the context of various embodiments, the transition metal may be selected from the group consisting of zinc (Zn), cadmium (Cd), copper (Cu), silver (Ag), gold (Au), nickel (Ni), palladium (Pd), platinum (Pt), cobalt (Co), rhodium (Rh), iridium (Ir), iron (Fe), ruthenium (Ru), osmium (Os), manganese (Mn), rhenium (Re), chromium (Cr), molybdenum (Mo), tungsten (W), vanadium (V).

In various embodiments, each nanostructure of the plurality of nanostructures 102, 104 may include or consist essentially of copper (Cu).

In various embodiments, each nanostructure of the plurality of conductive nanostructures 102, 104 may be (entirely) encapsulated or coated with a surfactant (or ligand). The surfactant may include at least one of an amine, a thiol or an acid. The surfactant may include a mixture of two or more types of the same class of surfactant, for example, a mixture of two or more different amines.

In various embodiments, the surfactant may include an amine. This may mean that the plurality of nanostructures 102, 104 may be amine-encapsulated nanostructures. The amine may include a short chain amine, for example, a primary amine, a secondary amine, or a ternary amine. Examples of primary amines and secondary amines that may be used may be as described in U.S. Pat. No. 9,095,898, the corresponding disclosure of which is incorporated herein by reference.

In the context of various embodiments, the amine may include at least one of a primary amine, a secondary amine, a ternary amine, a monodentate amine or a bidentate amine.

In the context of various embodiments, the amine may include a short chain amine, wherein the number of carbon in the carbon backbone or chain of the short chain amine may be between 1 and 20.

In various embodiments, the surfactant may have a boiling point of 200° C. or less (i.e., 200° C.).

In various embodiments, the ink composition 100 may further include a solvent (or carrier). It should be appreciated that at least some of the surfactant material may be present in the solvent. In various embodiments, the solvent may include an organic solvent (e.g., an alcohol). The solvent may include a mixture of two or more types of the same class of solvent, for example, a mixture of two or more different alcohols.

In various embodiments, the solvent may include an alcohol. The alcohol may include a short chain alcohol, for example, a primary alcohol, a secondary alcohol or a ternary alcohol.

In the context of various embodiments, the alcohol may include a short chain alcohol, wherein the number of carbon in the carbon backbone or chain of the short chain alcohol may be between 1 and 20.

In the context of various embodiments, the solvent may include at least one of isopropyl alcohol (IPA) (i.e., propan-2-ol), Butanol (C4OH), Pentanol (C5OH), Hexanol (C6OH), Heptanol (C7OH), Octanol (C8OH), Nonanol (C9OH), Decanol (C10OH), Undecanol (C11OH), Dodecanol (C12OH), a branched alcohol, a primary alcohol, a secondary alcohol, a tertiary alcohol, a glycol, or a glyme (e.g., diglyme, triglyme). In various embodiments, the solvent may include at least one of a straight chain primary alcohol with 4 to 10 carbon or a branched alcohol with 3 to 12 carbon.

In various embodiments, an amine may provide a reducing environment, which may minimise or protect the nanostructures 102, 104 from oxidization, thereby potentially prolonging the shelf life of the ink composition 100 and lowering the annealing temperature. Apart from coating the nanostructures 102, 104, the amine may also be present in the solvent of the ink composition 100 to provide a reducing environment.

In various embodiments, the solvent may have a boiling point of 200° C. or less (i.e., ≤200° C.).

In various embodiments, having a surfactant and/or a solvent with a low boiling point (≤200° C.) may be helpful in terms of processing with a polymeric substrate which may not be able to withstand high temperatures.

In various embodiments, the use of short chain, low boiling point (e.g., around or lower than 200° C.) solvents and/or surfactants may enable low temperature sintering of the nanostructures 102, 104 in the ink composition 100. Use of short chain solvents and/or surfactants may facilitate easy removal of the liquid content, thus reducing the annealing/sintering temperature. It should be appreciated that a low boiling point solvent-surfactant combination may enable fast drying and curing of deposited films/patterns using the ink composition, even at room temperature.

In various embodiments, as non-limiting examples, combinations of low boiling point solvent and surfactant that may be used may include 1-octanol (~195° C.) and n-octylamine (~178° C.), 1-hexanol and n-hexylamine and 1-decanol and n-decylamine. However, it should be appreciated that other combinations may be used. Low boiling point solvent-surfactant may be removed easily for the purpose of low sintering temperature.

In the context of various embodiments, a short chain alcohol may be used as the solvent and a short chain amine may be employed as the surfactant or ligand.

In the context of various embodiments, the alcohols may be the carrier solvents, with the amines being the much stronger coordinating ligand, i.e., the stronger Lewis base.

In various embodiments, a weight ratio of the solvent to the surfactant may be between about 1:1 and about 10000:1. For example, the ratio of the weight of the solvent to the weight of the surfactant may be between about between about 1:1 and about 5000:1, between about 1:1 and about 1000:1, between about 1:1 and about 500:1, between about 1:1 and about 100:1, between about 1:1 and about 20:1, between about 20:1 and about 10000:1, between about 20:1 and about 1000:1, or between about 100:1 and about 10000:1, e.g., about 1:1, about 10:1, about 20:1, about 100:1, about 200:1, or about 500:1. Preferably, the weight or amount of the solvent is more than the weight or amount of the surfactant.

It should be appreciated that any combination of solvent-surfactant may be employed as long as the solvent and the surfactant are compatible with one another. The solvent and the surfactant may be non-reactive to each other. The solvent and the surfactant may be of a compatible (or same) polarity. This may mean that both the surfactant and the solvent may be either polar or non-polar, which thereby may allow solubility with each other. As a non-limiting example, water soluble amines are compatible with water soluble alcohols (as solvents) but less compatible with amines/alcohols that are not soluble in water. Generally, an amine/alcohol with a hydrocarbon chain length totaling more than 6 carbons may not be soluble in water. As non-limiting examples, ethanol, IPA and water are polar, while 1-octanol is non-polar.

In various embodiments, the ink composition 100 may further include at least one additive. The additive may be added to modify a parameter of the ink composition 100, for example, at least one of a physical, mechanical or chemical property of the ink composition 100, e.g., the viscosity, the surface tension, adhesion to substrate etc. The additive may include at least one of a viscosity modifier (e.g., diamides, polyurethanes, glycerol), a surface tension modifier (e.g., polyvinylpyrrolidone (PVP), dodecanethiol) or a binder (e.g. ethyl cellulose). Other examples of additives that may be used may include polyvinylidene fluoride (PVDF) or polytetrafluoroethylene (PTFE).

In the context of various embodiments, the plurality of nanostructures 102, 104 may include at least one of nanoparticles, nanospheres (or spherical nanoparticles), nanorods, nanowires, nanoplates or any combination thereof. Nevertheless, it should be appreciated that the plurality of nanostructures 102, 104 may be of any polygonal shape.

In the context of various embodiments, the plurality of nanostructures 102, 104 may be free of an oxide.

Figure 1B:
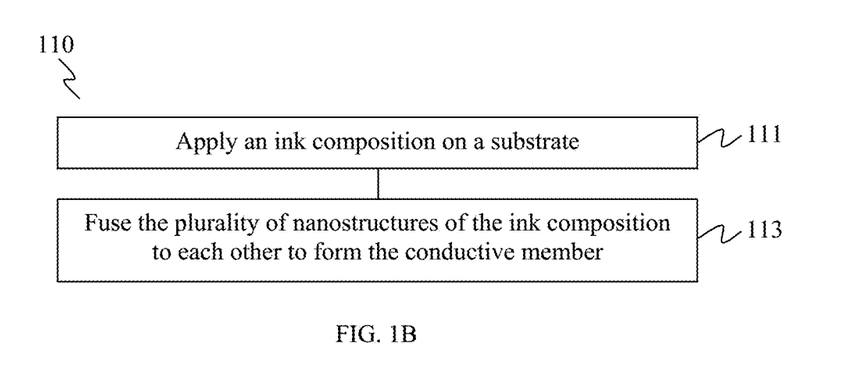
FIG. 1B shows a flow chart illustrating a method for forming a conductive member, according to various embodiments.

FIG. 1B shows a flow chart 110 illustrating a method for forming a conductive member, according to various embodiments.

At 111, an ink composition as described herein is applied (or deposited) on (or onto) a substrate (or carrier or support structure).

At 113, the plurality of nanostructures of the ink composition are fused to each other to form the conductive member.

In various embodiments, at 111, a solution deposition process may be used to apply (or deposit) the ink composition on the substrate. The solution deposition process may include at least one of spin coating, dip coating, spray coating, drop casting, doctor blading, inkjet printing, aerosol printing or a roll-to-roll process.

In various embodiments, at 111, the ink composition may be patterned on the substrate. This may include patterning the ink composition to allow lines, dots or any desired patterns to be formed on the substrate. The patterning process may be carried out prior to fusing at 113.

In various embodiments, at 113, the ink composition may be subjected to a heating process to fuse the plurality of nanostructures of the ink composition to each other. The heating process may be carried out in an environment including an inert gas (e.g., argon (Ar) or nitrogen ($N_2$)). For example, the heating process may be carried out in a furnace or oven. As a non-limiting example, the heating process may be or may include a sintering process, e.g., photonic sintering, laser sintering, microwave sintering, etc.

In various embodiments, a heating temperature of the heating process may be between about 25° C. and about 500° C., for example, between about 25° C. and about 300° C., between about 25° C. and about 200° C., between about 50° C. and about 500° C., between about 50° C. and about 300° C., between about 100° C. and about 500° C., between about 100° C. and about 300° C., between about 100° C. and about 200° C., or between about 200° C. and about 300° C.

In various embodiments, a heating temperature of the heating process may be about 200° C. or less (i.e., ≤200° C.), for example, ≤100° C., ≤50° C., e.g., about 100° C.-200° C., or about 150° C.

While the method described above is illustrated and described as a series of steps or events, it will be appreciated that any ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments described herein. Also, one or more of the steps depicted herein may be carried out in one or more separate acts and/or phases.

Figure 1C:
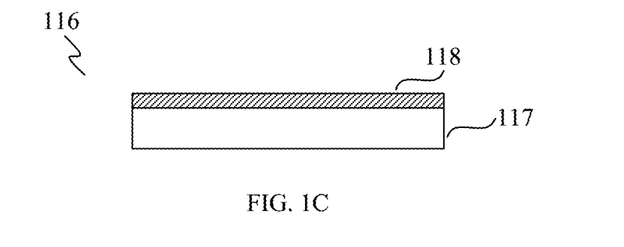
FIG. 1C shows a schematic cross-sectional view of a conductive device, according to various embodiments.

FIG. 1C shows a schematic cross-sectional view of a conductive device 116, according to various embodiments. The conductive device 116 includes a substrate 117, and a conductive member 118 on the substrate 117, wherein the conductive member 118 is made of the ink composition as described herein (e.g., ink composition 100), the ink composition processed to fuse the plurality of nanostructures (e.g., 102, 104) of the ink composition to each other.

In other words, a conductive device 116 may be provided based on the ink composition (e.g., 100, FIG. 1A) of various embodiments. The conductive device 116 may be formed by application or deposition of the ink composition on or onto a substrate (or carrier or support structure) 117 and subsequent processing (e.g., sintering) of the ink composition to form a conductive member 118. As a result of the processing, the plurality of nanostructures of the ink composition are fused to each other to form the conductive member 118. Further, as a result of the processing, any solvent and/or surfactant present in the ink composition may be removed or burnt off, for example, via evaporation.

In various embodiments, the conductive member 118 may include at least one of a continuous film, a line or a dot. However, it should be appreciated that the conductive member 118 may be in any desired pattern, which may be defined during deposition of the ink composition on the substrate 117.

In various embodiments, the substrate 117 may include at least one of a metal (e.g. aluminium (Al), copper (Cu), etc.), a ceramic (e.g. glass, alumina, etc.) or a polymer (e.g. polyimide, polyethylene terephthalate (PET), polyethylene naphthalate (PEN), etc.).

In various embodiments, a flexible substrate 117 may be used, which may be a polymeric substrate.

In the context of various embodiments, the conductive device 116 may be or may include an electrode (e.g., a flexible electrode), or the conductive member 118 may define or may be an electrode. For example, this may mean that the substrate 117 may be a flexible substrate and the conductive device 116 may be or may include a flexible electrode.

In the context of various embodiments, the terms "fuse" and "fusing" may mean sintering, or joining together as an (single) entity. This may mean that there may not be clear or obvious boundary observable between two materials (or structures) when the two materials are fused to each other. Further, the two materials fused to each other may not be separate or distinct.

It should be appreciated that descriptions in the context of the ink composition 100, the method for forming a conductive member, and the conductive device 116 may correspondingly be applicable in relation to any one of the others as described herein.

Figure 2:
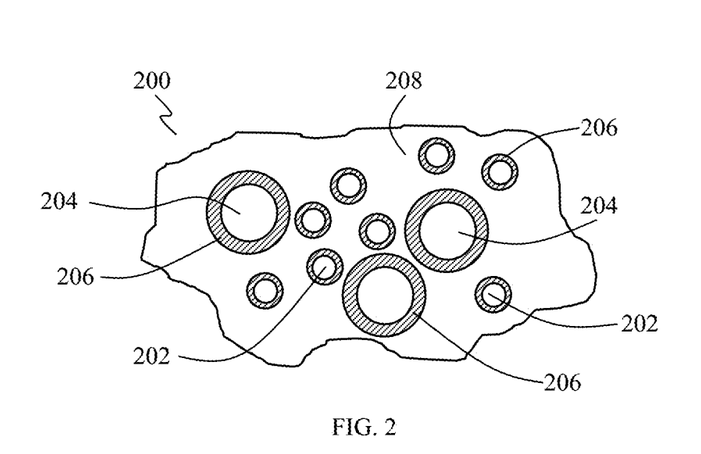
FIG. 2 shows a schematic cross-sectional view of an ink composition, according to various embodiments.

FIG. 2 shows a schematic cross-sectional view of an ink composition 200, according to various embodiments. The ink composition 200 may include a plurality of nanostructures or nanoparticles 202, 204, distributed in at least two cross-sectional dimension ranges, for example, nanostructures 202 (smaller nanostructures) of a cross-sectional dimension within a first range or distribution, and nanostructures 204 (larger nanostructures) of a cross-sectional dimension within a second range or distribution. As would be appreciated, the numerical values for the cross-sectional dimension in the first range are smaller than those in the second range. Each nanostructure 202, 204 may include or may be encapsulated by a surfactant 206 (e.g., an amine). The ink composition 200 may include a solvent 208 (e.g., an alcohol). It should be appreciated that while the surfactant 206 is represented as a surface layer or shell layer in FIG. 2, some surfactants (e.g., amine) may in effect be molecules adsorbed on the nanostructures 202, 204, surrounding the nanostructures 202, 204, with each molecule having a tail extending away from the corresponding nanostructure 202, 204.

While the nanostructures 202 are illustrated as of a uniform cross-sectional dimension and of a uniform spherical shape, different nanostructures 202 may have different cross-sectional dimensions within a (first) cross-sectional dimension range and/or of different shapes. While the nanostructures 204 are illustrated as of a uniform cross-sectional dimension and of a uniform spherical shape, different nanostructures 204 may have different cross-sectional dimensions within a (second) cross-sectional dimension range and/or of different shapes.

Preparation of an ink composition will now be described by way of the following non-limiting example using copper nanoparticles. The copper (Cu) nanoparticles may be formed using the method described in U.S. Pat. No. 8,486,305, the entire disclosure of which is incorporated herein by reference. The copper (Cu) nanoparticles raw material may be washed using isopropanol (IPA) two times to remove impurities and excess surfactants. After that, the raw material may be washed one more time using pentane, which may help to dry the raw material and obtain solid pellet for subsequent ink formulation. According to a non-limiting example, about 1 g of as washed Cu raw material may be mixed with about 9 g of 1-octanol (solvent) and n-octylamine (surfactant) mixture in a 20 ml bottle (10 wt % Cu ink), and may be stirred overnight to obtain a homogeneous NanoCu ink.

The solvent/surfactant may be replaced by any other alcohol-amine combinations on condition that the selected alcohol and amine are compatible to each other. The concentration of the nanoparticles in the ink may be varied from about 1 wt % to about 60 wt %, and the ratio between the solvent and the surfactant may also be tuned. In order to tune the viscosity, surface tension and film finish, chemical additives including but not limited to PVP, ethyl cellulose, PVDF and PTFE may also be included in the ink composition or formulation. The ink formulation may be adopted for Cu nanoparticles prepared via various other methods.

The NanoCu ink may be deposited on a substrate using solution deposition techniques such as drop casting, dip coating, spin coating, spray coating, inkjet printing, aerosol printing, doctor blading and roll-to-roll processes. The substrates may be chosen from all categories of materials, including but not limited to, metal (e.g., Al, Cu), ceramics (e.g., glass, alumina) and polymers (e.g. polyimide, PET, PEN). After deposition, the substrates may be annealed at a fairly low temperature (about 100° C. 200° C.) in an inert gas environment to remove solvents/surfactants/additives, to enhance fusion and grain growth and to make the films/patterns (of the ink) conductive.

Figure 3:
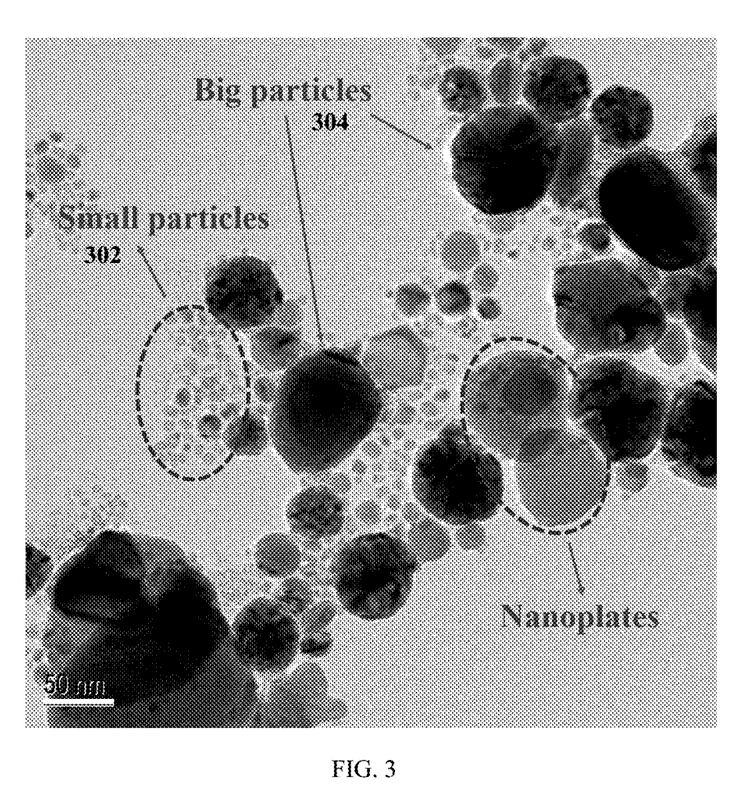
FIG. 3 shows a transmission electron microscopy (TEM) image of copper nanoparticles. The scale bar represents 50 nm.

FIG. 3 shows a transmission electron microscopy (TEM) image of copper nanoparticles (e.g., nanoplates). While not clearly shown, the copper nanoparticles are amine-encapsulated. As may be observed, the size of the Cu nanostructures ranges from a few to more than 100 nm. The nanostructures contain a significant number of small nanoparticles nm) 302 population. The small particles 302 may be beneficial in the NanoCu ink of various embodiments for two reasons. First, the small particles 302 have high surface energy, which may contribute to lowering of the sintering temperature. Secondly, the small nanoparticles 302 may fill in the empty space between big nanoparticles 304 and improve film densification. It may also be observed in FIG. 3 that the nanoparticles 302, 304 are separate nanoparticles, with no observable agglomeration.

Figure 4A:
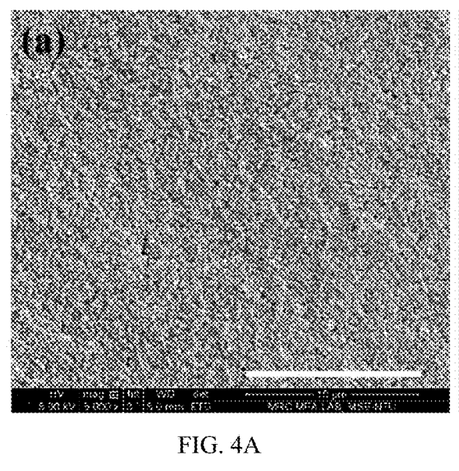
FIGS. 4A and 4B show scanning electron microscopy (SEM) images of the top view and cross-sectional view of drop-casted Cu films respectively. The scale bars represent 10 μm (FIG. 4A) and 1 μm (FIG. 4B).
Figure 4B:
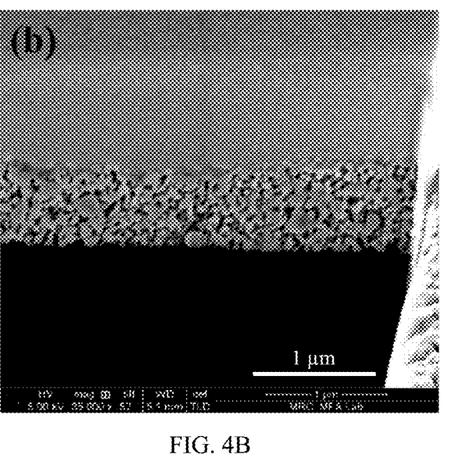

The NanoCu ink of various embodiments exhibits good wetting properties and may be deposited on various common substrates. Cu thin films may be deposited by drop casting on silicon (Si), glass and polyimide substrates, and the corresponding wetting angles for Si, glass and polyimide are determined to be about 25.77°, 24.74° and 13.10° respectively. As shown in the SEM images of FIGS. 4A and 4B, the as-deposited NanoCu film is quite uniform with low surface roughness. The film is compact with no obvious cracks and the thickness is about 1 μm.

Figure 4C:
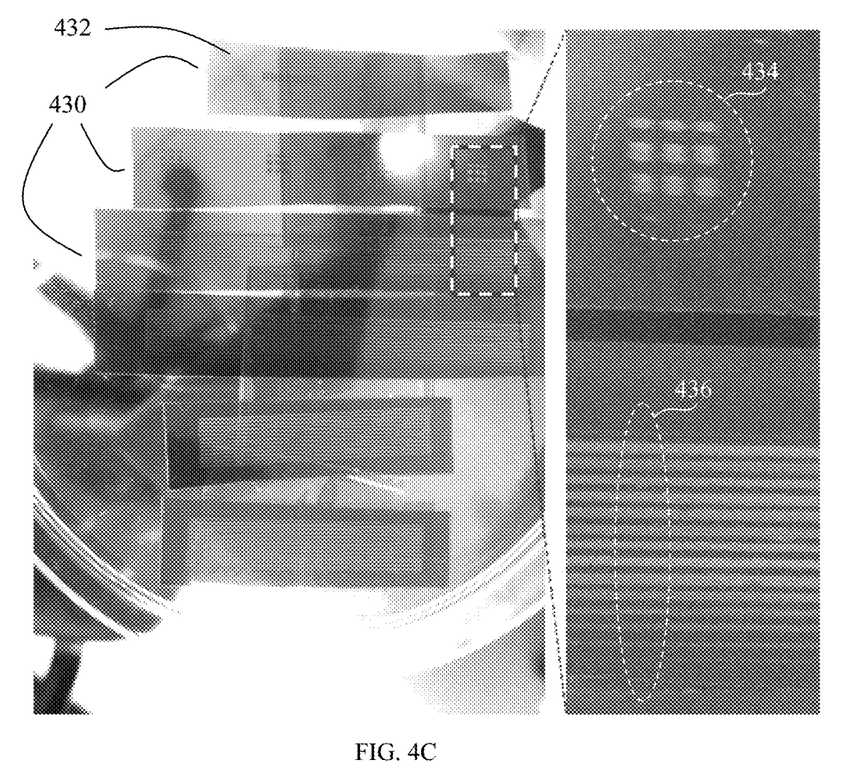
FIG. 4C shows lines/dots patterns deposited using inkjet printing of NanoCu ink.
Figure 4D:
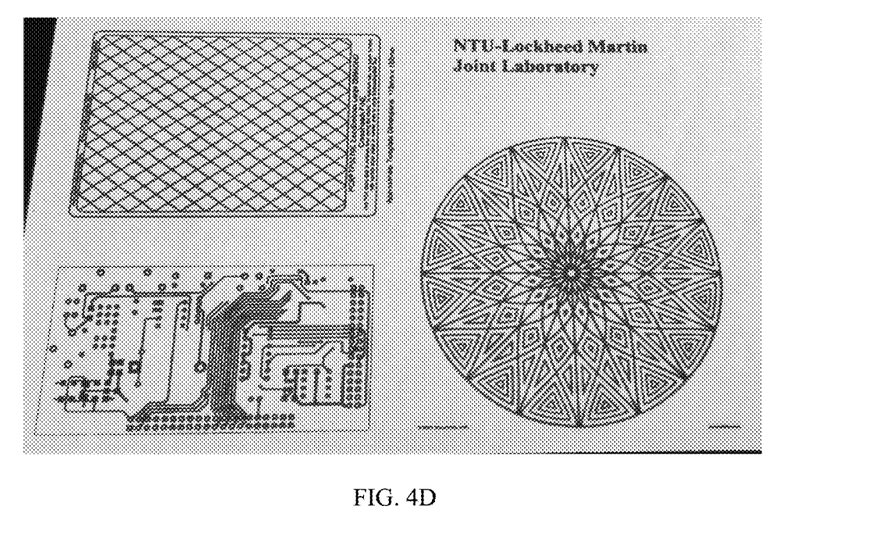
FIG. 4D shows complex patterns formed using the inkjet printing of NanoCu ink of various embodiments.

Besides continuous films, dots and lines, and complex patterns may be formed with the NanoCu ink of various embodiments using various printing techniques such as inkjet printing and aerosol printing. FIG. 4C shows lines/dots patterns deposited using the NanoCu ink by inkjet printing, illustrating some samples 430 with NanoCu dots 434 or NanoCu lines 436 deposited on substrates 432. Further, FIG. 4D shows some patterns formed using the NanoCu ink. For FIGS. 4C and 4D, the patterns formed are as deposited, followed by curing or drying.

Figure 5:
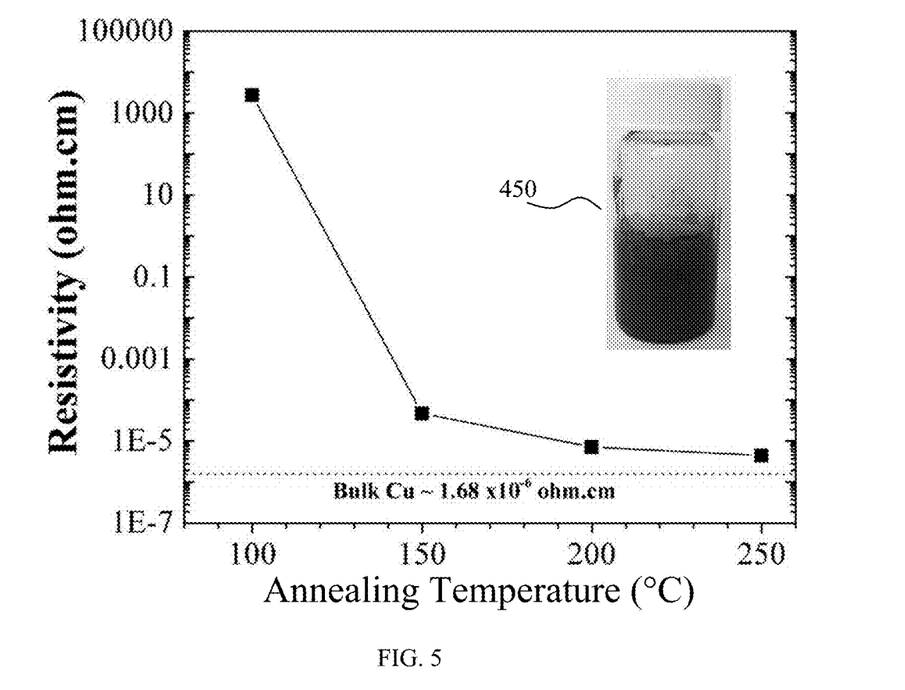
FIG. 5 shows a plot of resistivity of the NanoCu film as a function of annealing temperature, according to various embodiments.

Good electrical performance is one of the key criteria for the conductive film formed using the ink. The as-deposited thin films using the NanoCu ink of various embodiments is annealed at temperatures of about 100° C., 150° C., 200° C. and 250° C. for about 30 minutes, and their corresponding resistivity (in Ω·cm) are plotted in FIG. 5. The inset in FIG. 5 shows a bottle 450 of 25 ml, which contains 10 gram of NanoCu ink. The results shown in FIG. 5 are independent of the thickness of the annealed film formed.

As may be observed, the resistivity decreases with an increase in the annealing temperature. The low temperature annealing or sintering (<200° C.) is particularly advantageous for flexible electronics applications because most flexible substrates are polymers (e.g., polyimide, PET, PEN) and many of them are not able to withstand a high temperature environment. Low temperature sintered electrodes are also necessary because some electronics components may malfunction and break down permanently under high temperatures.

Figure 6:
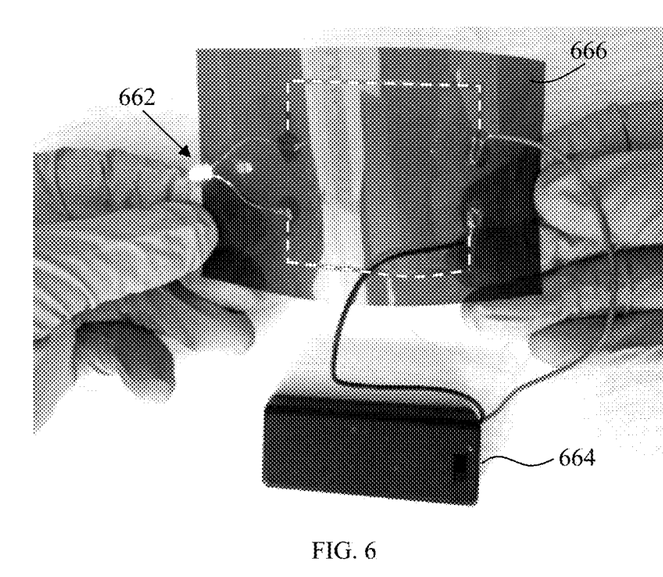
FIG. 6 shows a photograph illustrating printed circuits demonstration involving an LED (light emitting device).

The annealed NanoCu ink shows good adhesion and flexibility, which may be used in flexible electronics. FIG. 6 shows a photograph illustrating demonstration involving an LED 662. As shown in the photograph, when the LED 662 is connected via electrodes (white dashed lines are superimposed on the electrodes for clarity purposes) formed of annealed or sintered NanoCu ink to a power source (e.g., battery) 664 and switched on, the LED 662 lights up. It may also be observed that the substrate 666 on which the electrodes are formed on, is in a bent state.

Figure 7:
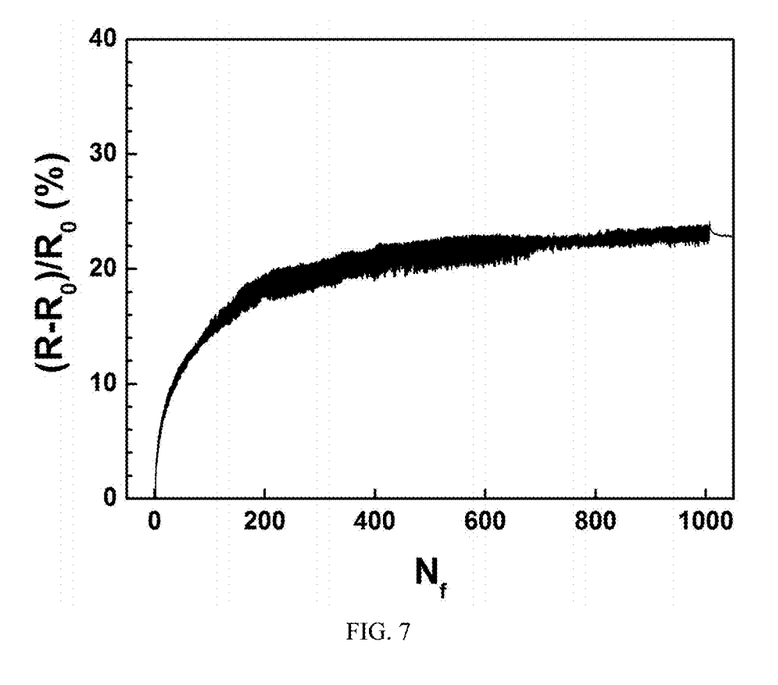
FIG. 7 shows a plot of results for a flexibility analysis using cyclic bending test for 1000 cycles, according to various embodiments.

The flexibility analysis of the NanoCu electrode of various embodiments was performed using cyclic bending test for 1000 cycles, where the results are as shown in FIG. 7, where the change in resistance $(R-R_0)/R_0$ is plotted over the number of bending cycles ($N_f$). The parameter "$R_0$" represents the initial resistance, while the parameter "R" represents the resistance after a certain number of bending of the electrode. It may be observed that the resistance change may be quite huge during the first 20 cycles which may be attributed to crack formation and propagation at the initial stage of bending cycles. The change in resistance gradually tends to stabilize after around 200 cycles because the density of cracks may be saturated. The overall change in resistance is about 23% after 1000 cycles of bending. It should be appreciated that the film thickness and/or the annealing profile may be optimised to reduce the change in resistance to less than about 30%.

Non-limiting examples of the properties of the NanoCu ink/film of various embodiments may be as shown in Table 1 below.

TABLE 1

| Particle size | Tunable distribution 5~100 nm |
|---|---|
| Activation temperature | 120° C. |
| Resistivity | ~$10^{-5}$ Ω·cm (200° C.) |
| Solid content | 1 to 50 wt % |
| Viscosity | Tunable from 10 to 1000 cP |
| Surface tension | 20-30 mN/m |
| Solvent | Organic |

As described, various embodiments may provide an ink formulation including or consisting of (i) Cu nanostructures, (ii) a short chain alcohol based solvent, (iii) a short chain amine based surfactant, and (iv) one or more additives.

The Cu nanostructures may be nano-size Cu in any shapes including but not limited to nanoparticles, nanoplates, nanorods, nanowires, or a mixture of any of the above-mentioned shapes or structures.

The size (or cross-sectional dimension) of the Cu nanostructures may range from about 2 nm to about 200 nm.

The size distribution of the Cu nanostructures may be poly-dispersed, or including or consisting of two or more distinct size distributions.

The short chain alcohol may be a primary alcohol, a secondary alcohol or a ternary alcohol.

The number of carbons in the carbon backbone for the short chain alcohol may range from 1 to 20.

The alcohol solvent may include more than one alcohol, for example, two, three or any higher number.

The short chain amine may include a primary amine, a secondary amine or a ternary amine.

The number of carbons in the carbon backbone for the short chain amine may range from 1 to 20.

The amine surfactant may include more than one amine, for example, two, three or any higher number.

The additive(s) may include a chemical or material that may tune one or more physical or chemical properties of the ink, including but not limited to, polyvinylpyrrolidone (PVP), ethyl cellulose, polyvinylidene fluoride (PVDF) and polytetrafluoroethylene (PTFE).

The additive(s) may include more than one chemical, for example, two, three or any higher number.

The Cu loading in the ink may range from about 1 wt % up to about 60 wt %, for example, 10 wt %-30 wt %.

The alcohol to amine ratio (e.g., weight ratio) may be any ratio greater than 1:1 on condition that the stability of the ink is not deteriorated.

The ink may be deposited using solution deposition techniques including but not limited to drop casting, dip coating, inkjet printing, aerosol printing, spray coating, doctor blading and roll-to-roll processes.

The ink may be sintered in an inert gas environment to make the resulting material conductive.

The sintering temperature may range from about 25° C. to about 500° C.

The sintered Cu film may employ a polymeric substrate and be used as a flexible electrode.

As described above, various embodiments may provide a highly stable NanoCu ink based on alcohol solvents and amine surfactants, and may also provide flexible electrodes using the as developed NanoCu ink. Using the copper-based ink (NanoCu ink) as a non-limiting example, various embodiments may provide one or more of the following:

(i) The NanoCu ink may exhibit high oxidation resistance due to a reducing environment associated with one or more amine components.

(ii) Low boiling point alcohol solvent-amine surfactant combination may enable fast drying and curing of deposited films/patterns even at room temperature.

(iii) The chemicals involved in the formulation (non limiting example: 1-octanol, n-octylamine) are relatively low-cost, making the NanoCu ink cost-effective.

(iv) The Cu nanoparticles used may include two distinct populations or distributions (large particles and small particles), where the small particles may fill in the empty space(s) between the big particles and thereby enhance film densification.

(v) The ink formulation processes may be readily scaled up to industrial level.

(vi) The NanoCu ink may allow the use of solution deposition techniques including, but not limited to, spray coating, inkjet printing, aerosol jet printing, drop-casting and doctor blading and roll-to-roll processes.

(vii) Low sintering temperature (100~200° C.) may be possible to achieve reasonable low resistivity (<$10^{-4}$ Ω·cm).

(viii) The resistivity may be reduced to the μΩ·cm range, which is in the same order of magnitude with bulk copper.

(ix) The NanoCu ink may be used for flexible electrodes.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An ink composition comprising:
   a plurality of copper nanostructures distributed in at least two cross-sectional dimension ranges having a maximum cross-sectional dimension of about 200 nm or less and the at least two cross-sectional dimension ranges are spaced apart from each other;
   wherein the at least two cross-sectional dimension ranges comprise a first range of about 2 nm to about 20 nm and a second range of about 30 nm to about 200 nm; and
   wherein each of the plurality of copper nanostructures is encapsulated with an amine surfactant.

2. The ink composition as claimed in claim 1, wherein an amount of copper nanostructures in the ink composition is about 1 wt % to about 60 wt %.

3. The ink composition as claimed in claim 1, wherein the copper nanostructures comprise copper nanoparticles.

4. The ink composition as claimed in claim 1, wherein the amine surfactant comprises two or more different amines.

5. The ink composition as claimed in claim 1, wherein the amine surfactant has a boiling point of 200° C. or less.

6. The ink composition as claimed in claim 1, further comprising:
   a solvent.

7. The ink composition as claimed in claim 6, wherein the solvent comprises an alcohol.

8. The ink composition as claimed in claim 6 or claim 7, wherein the solvent has a boiling point of 200° C. or less.

9. The ink composition as claimed in claim 6, wherein a weight ratio of the solvent to the amine surfactant is about 1:1 to about 10000:1.

10. The ink composition as claimed in claim 1, further comprising:

at least one additive.

11. A method for forming a conductive member, the method comprising:

applying an ink composition on a substrate, wherein the ink composition comprises a plurality of copper nanostructures distributed in at least two cross-sectional dimension ranges having a maximum cross-sectional dimension of about 200 nm or less and the at least two cross-sectional dimension ranges are spaced apart from each other wherein the at least two cross-sectional dimension ranges comprise a first range of about 2 nm to about 20 nm and a second range of about 30 nm to about 200 nm; and wherein each of the plurality of copper nanostructures is encapsulated with an amine surfactant; and fusing the plurality of copper nanostructures of the ink composition to each other to form the conductive member.

12. The method as claimed in claim 11, wherein applying the ink composition comprises a solution deposition process.

13. The method as claimed in claim 11, wherein applying the ink composition comprises patterning the ink composition on the substrate.

14. The method as claimed in claim 11, wherein fusing the plurality of copper nanostructures of the ink composition to each other comprises subjecting the ink composition to a heating process.

15. The method as claimed in claim 14, wherein a heating temperature of the heating process is about 25° C. to about 500° C.

16. The method as claimed in claim 14, wherein a heating temperature of the heating process is about 200° C. or less.

* * * * *